United States Patent [19]

Otani

[11] Patent Number: 5,661,090

[45] Date of Patent: Aug. 26, 1997

[54] PROCESS AND APPARATUS FOR MANUFACTURING CERAMIC SEMICONDUCTOR PACKAGES

[75] Inventor: Noriaki Otani, Mine, Japan

[73] Assignee: Sumitomo Metal (SMI) Electronics Devices, Inc., Mine, Japan

[21] Appl. No.: 668,852

[22] Filed: Jun. 24, 1996

[30] Foreign Application Priority Data

Jun. 30, 1995 [JP] Japan .................. 7-188242

[51] Int. Cl.$^6$ .............................................. H01L 21/60
[52] U.S. Cl. ...................... 437/218; 437/209; 437/214; 437/219; 437/220
[58] Field of Search ........................ 437/209, 210, 437/211, 212, 213, 214, 215, 216, 217, 218, 219, 220; 29/25.07; 414/935, 941

[56] References Cited

U.S. PATENT DOCUMENTS

| | | | |
|---|---|---|---|
| 5,019,209 | 5/1991 | Hiraide et al. | 437/220 |
| 5,200,368 | 4/1993 | Kojima et al. | 437/217 |
| 5,264,002 | 11/1993 | Egashira et al. | 29/25.01 |
| 5,352,633 | 10/1994 | Abbott | 437/211 |
| 5,372,972 | 12/1994 | Hayashi et al. | 437/214 |
| 5,410,804 | 5/1995 | Berendts | 437/209 |
| 5,537,737 | 7/1996 | Kamakura et al. | 437/220 |
| 5,548,890 | 8/1996 | Tada et al. | 437/220 |
| 5,569,625 | 10/1996 | Yoneda et al. | 437/217 |

*Primary Examiner*—Kevin Picardat
*Attorney, Agent, or Firm*—Burns, Doane, Swecker & Mathis, LLP

[57] ABSTRACT

Ceramic semiconductor packages which comprise a lead frame (1) having registering holes (4, 5) and a ceramic substrate (2) having a thermally fusible bonding material such as a resin or glass applied to the sealing surface (6) of the substrate are manufactured by positioning the lead frame, using a transfer device (14), on a lead frame-supporting plate (11) having holes (20, 21), through which positioning pins (22) formed on a positioning base (12) are made to protrude by lifting the base (12) by a driving mechanism (13), in such a manner that the positioning pins pass through the registering holes (4, 5) of the lead frame. The substrate is then centered and positioned on the lead frame using a transfer device (15) having chuck hands (33). Thereafter, the bonding material is fused by heating in a heating furnace (16) to bond the lead frame and the substrate.

7 Claims, 4 Drawing Sheets

PROCESS AND APPARATUS FOR MANUFACTURING CERAMIC SEMICONDUCTOR PACKAGES

BACKGROUND OF THE INVENTION

The present invention relates to a process and an apparatus for manufacturing ceramic packages for semiconductor elements such as IC chips (hereinafter referred to as ceramic semiconductor packages). More particularly, the present invention is concerned with a process and an apparatus for manufacturing ceramic semiconductor packages which comprise a lead frame having registering (guiding) holes and a ceramic substrate having a thermally fusible bonding material such as a resin or glass applied to the sealing surface of the substrate. The process and apparatus are capable of improving the positioning accuracy of the lead frame and the substrate when they are bonded together by heating to fuse the bonding material.

In recent years, there has been a tendency for the number of leads to increase in square or rectangular ceramic semiconductor packages having leads extending from all four sides such as CQFP's (ceramic quad flat packages). This tendency is accompanied by a growing demand for positioning accuracy in wire bonding in which a semiconductor chip is electrically connected to a lead frame by bonding wires usually made of aluminum or gold. This demand, in turn, requires an improvement in the accuracy of positioning when the lead frame is bonded to a ceramic substrate to manufacture a ceramic semiconductor package.

Figure 6A:
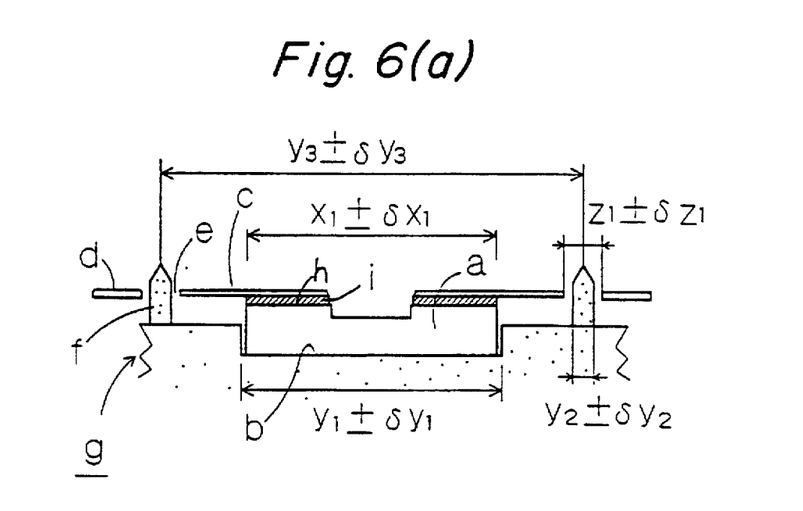
FIG. 6 is a schematic diagram showing a conventional device for positioning a lead frame and a substrate.
Figure 6B:
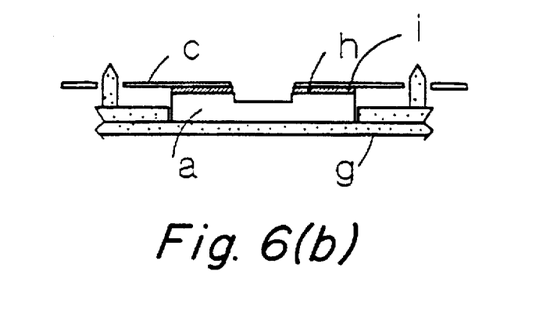

The positioning of a lead frame and a ceramic substrate has usually been performed, as shown in FIG. 6, by using a positioning jig g made of stainless steel. The positioning jig g has a recess b at the center of the jig for receiving a ceramic substrate a, and positioning pins f projecting upwards at the periphery of the jig so as to go through registering holes e formed in the peripheral tie bar portions d of a lead frame c.

Before the lead frame c is bonded to the ceramic substrate a by using the positioning jig g, a thermally fusible bonding material i such as a sealing glass is applied to the sealing surface h of the substrate a by means of screen printing, for example. Thereafter, the substrate a is placed into the recess b of the positioning jig g with the sealing surface h facing up, and the lead frame c is put on the bonding material i applied to the sealing surface h of the substrate a while achieving positioning by passing the positioning pins f of the jig g through the registering holes e of the lead frame c. Subsequently, the substrate a and the lead frame c anchored to the jig g are heated at a temperature above the fusing (melting) temperature of the bonding material i (about 350° to 500° C. when the bonding material is a sealing glass) to fuse the bonding material i, thereby performing bonding by causing the lead frame c to settle down onto the fused bonding material i.

However, the manufacture of ceramic semiconductor packages by bonding a lead frame and a ceramic substrate using the above-described positioning jig suffers from the following problems.

1) The positioning jig can be used interchangeably for the manufacture of packages having different designs only when the substrates a have the same outer dimensions and the lead frames c to be bonded to the substrate a have registering holes with the same dimensions at the same positions. Therefore, as a practical matter, different positioning jigs made of stainless steel must be provided for the manufacture of ceramic semiconductor packages having different designs. As a result, in the manufacture of limited numbers of a wide variety of packages, the manufacturing costs are increased and the manufacturing period is prolonged.

2) Positioning is performed by placing the lead frame c on the substrate a which is received in the recess b of the positioning jig g. Due to the light weight of the lead frame c placed on the substrate a, misregister tends to occur by displacement of the lead frame c when the substrate a and the lead frame c are bonded together.

3) The dimensions of the ceramic substrate a fluctuate due to firing shrinkage in the course of a process for preparation thereof. Therefore, each horizontal dimension ($y_1$) of the recess b of the positioning jig g, in which the substrate a is received, must be determined so as to allow for both maximum deviation ($\pm\delta x_1$) from the corresponding horizontal nominal dimension of the substrate ($x_1$) and maximum tolerance of finished dimension ($\pm\delta x_1$) of the recess b. Thus, the dimension $y_1$ of the recess is set so as to equal the sum of $x_1+\delta x_1+\delta y_1$. As a result, the horizontal position of the substrate a received in the recess b has a maximum deviation equal to $(\delta x_1+\delta y_1)/2$.

4) The positioning jig g must be fabricated so as to allow for the tolerances of the finished dimensions ($\delta y_2$, $\delta y_3$, and $\delta z_1$) of the diameter of the positioning pins ($y_2$), the distance between the positioning pins ($y_3$), and the diameter of registering holes ($z_1$) formed in the lead frame, respectively.

Of these dimensional accuracies or tolerances, the accuracy of the substrate a ($\pm\delta x_1$) has the largest value: is the major factor which influences positional deviation between the substrate and lead frame. As shown in Table 1 below, the dimensional accuracy of the substrate a is from $\pm0.15$ mm to $\pm0.25$ mm, while the accuracies or tolerances of the other dimensions are on the order of $\pm0.05$ mm.

TABLE 1

| Dimension | Accuracy or Tolerance | Influence |
| --- | --- | --- |
| Substrate, $x_1$ | $\pm\delta x_1 = \pm0.15 - 0.25$ mm | Maximum |
| Jig, $y_1$ | $\pm\delta y_1 = \pm0.05$ mm | Moderate |
| Jig, $y_1$ | $\pm\delta y_2 = \pm0.05$ mm | Moderate |
| Jig, $y_1$ | $\pm\delta y_3 = +0.05$ mm | Moderate |
| Lead frame, $z_1$ | $\pm\delta z_1 = \pm0.05$ mm | Minimum |
| Overall accuracy: | $\pm0.18 - 0.27$ mm | |

As long as the above-described positioning jig is used, the substrate must be initially positioned in the recess of the jig before the lead frame is positioned on the substrate. In this case, the large dimensional accuracy of the substrate must always be taken in to consideration when designing the jig.

SUMMARY OF THE INVENTION

The present invention relates to a process and an apparatus for manufacturing ceramic semiconductor packages by positioning a lead frame, which has an inner and an outer lead portion and registering holes, and a ceramic substrate having a thermally fusible bonding material such as a resin or glass applied to the sealing surface of the substrate, followed by heating to fuse the bonding material, thereby bonding the lead frame and the substrate together.

It is an object of the present invention to provide such a process and apparatus which are capable of improving the positioning accuracy of the lead frame and the substrate before they are bonded with the fused bonding material.

The present inventor found that this object can be achieved by initially positioning the lead frame and thereafter positioning the substrate on the inner lead portion of the lead frame, without use of the above-described positioning jig.

In one aspect, the present invention provides a process for manufacturing ceramic semiconductor packages by positioning (1) one or more lead frames or a train of lead frames having registering holes in the peripheral portion thereof, each lead frame having an inner lead portion to be connected to a semiconductor element and an outer lead portion to be connected to external terminals, and (2) one or more ceramic substrates each having a thermally fusible bonding material applied to a sealing surface of the substrate, followed by heating to fuse the bonding material to bond the lead frames and the substrates together, wherein the process comprises the steps of:

- providing a lead frame-supporting plate having pin-receiving holes for registration in positions matched to the positions of the registering holes of the lead frames when the lead frames are positioned on the supporting plate;
- providing a positioning base beneath the lead frame-supporting plate, the positioning base having positioning pins at the same intervals as the registering holes of the lead frames;
- lifting the positioning base until the positioning pins of the base pass through the pin-receiving holes of the lead frame-supporting plate and protrude therefrom;
- positioning the lead frames or lead frame train on the lead frame-supporting plate such that the positioning pins of the positioning base, which protrude from the plate, pass through the registering holes of the lead frames;
- centering and positioning each of the ceramic substrates, with its sealing surface facing down, on the inner lead portion of each lead frame on the lead frame-supporting plate, the positioning being performed in such a manner that the center of the substrate coincides with that of the lead frame; and
- lowering the positioning base until the positioning pins of the base are withdrawn from the registering holes of the lead frames and from the pin-receiving holes of the lead frame-supporting plate.

The present invention also provides an apparatus for manufacturing ceramic semiconductor packages by positioning (1) one or more lead frames or a train of lead frames having registering holes in the peripheral portion thereof, each lead frame having an inner lead portion to be connected to a semiconductor element and an outer lead portion to be connected to external terminals, and (2) one or more ceramic substrates each having a thermally fusible bonding material applied to a sealing surface of the substrate, followed by heating to fuse the bonding material to bond the lead frames and the substrates together, wherein the apparatus comprises:

- a lead frame-supporting plate having pin-receiving holes for registration in positions matched to the positions of the registering holes of the lead frames when the lead frames are positioned on the supporting plate;
- a vertically movable positioning base beneath the lead-frame-supporting plate, the positioning base having positioning pins at the same intervals as the registering holes of the lead frames;
- means for vertically moving the positioning base to allow the positioning pins of the base to pass through the pin-receiving holes of the plate and protrude therefrom;
- means for positioning the lead frames or lead frame train on the lead frame-supporting plate such that the positioning pins of the positioning base, which protrude from the lead frame-supporting plate, pass through the registering holes of the lead frames; and
- means for centering and positioning the ceramic substrates, the means capable of centering a ceramic substrate and then positioning it, with its sealing surface facing down, on the inner lead portion of each lead frame on the lead frame-supporting plate in such a manner that the center of the substrate coincides with that of the lead frame.

In accordance with the present invention, the lead frames, which may be either separated or in the form of a train of lead frames, are positioned by placing them on the lead frame-supporting plate such that the positioning pins of the positioning base which protrude from the lead frame-supporting plate through the pin-receiving holes thereof pass through the registering holes of the lead frames. Thereafter, each of the ceramic substrates is positioned, with its sealing surface facing down, on the inner lead portion of each lead frame which is fixed in place by the positioning pins.

Therefore, regardless of the dimensional accuracy of the ceramic substrate, registration of the lead frames and the substrates can be achieved precisely by centering each substrate and positioning it such that the center of the substrate coincides with the center of one of the lead frames.

Furthermore, the weight of the substrate is exerted on the lead frame, thereby making it possible to alleviate misregistration of the lead frame and substrate due to displacement during bonding of these members.

In a preferred embodiment of the process according to the present invention, a temporary adhesive which can be removed by heating is applied to the bonding area of each ceramic substrate or lead frame such that the substrate positioned on the inner lead portion of the lead frame is temporarily secured to the lead frame by the adhesive before the lead frame and the substrate are bonded by fusing the bonding material applied to the sealing surface of the substrate.

As a result, the above-described misregistration during bonding is further alleviated. Since the temporary adhesive disappears during heating to fuse the bonding material, it does not adversely affect the bonding properties of the bonding material.

In a preferred embodiment of the apparatus according to the present invention, a plurality of the lead frame-supporting plates are mounted on a conveyor. The conveyor is passed through a heating furnace in which the bonding material applied to the sealing surface of the substrate is fused to bond the lead frame and the substrate. The positioning base is located independently of the conveyor in front of the inlet of the heating furnace (backward of the inlet with respect to the travelling direction of the conveyor).

By employing such a design, after the lead frames and the substrates are positioned on each of the lead frame-supporting plates mounted on the conveyor, the positioning pins of the positioning base can be withdrawn from the registering holes of the lead frames and the pin-receiving holes of the lead frame-supporting plate. Therefore, the lead frame and substrate positioned on each lead frame-supporting plate are conveyed into the heating furnace in such conditions that they are free from position control of any positioning pins, thereby eliminating the possibility that misregistration occurs due to thermal expansion of the lead frame during heating to fuse the bonding material and bond the lead frame and the substrate.

DESCRIPTION OF THE PREFERRED EMBODIMENT

Referring to the accompanying drawings, the present invention will be described in detail with respect to a specific embodiment.

Figure 1A:
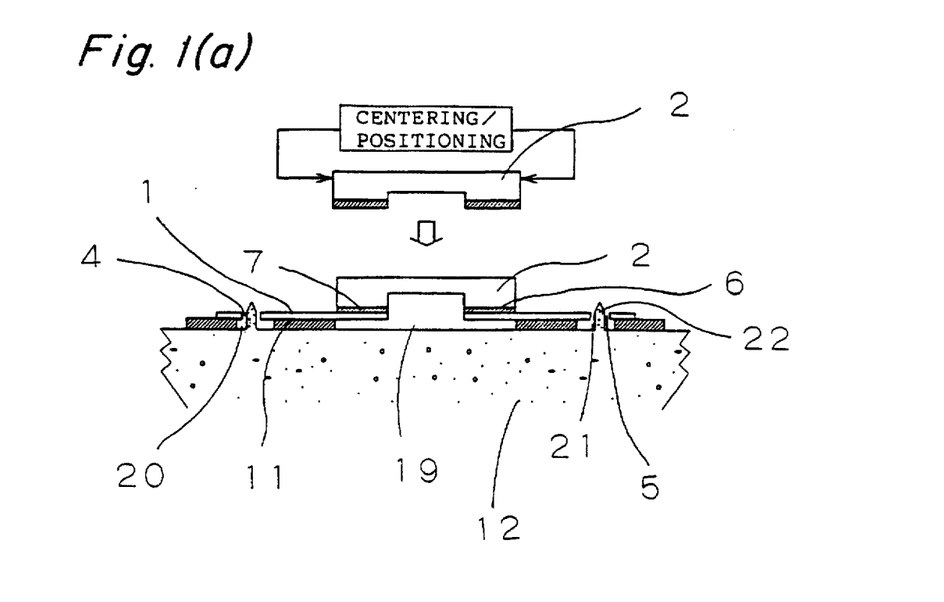
FIGS. 1(a) and 1(b) schematically illustrate a device for positioning lead frames and ceramic substrates used in the practice of the present invention.
Figure 1B:
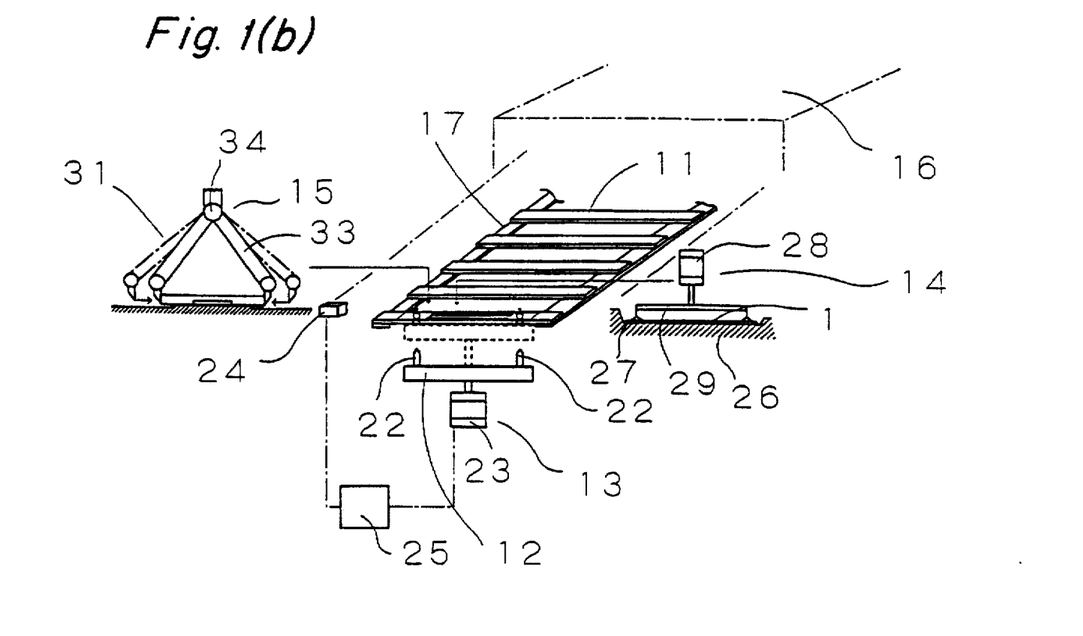
Figure 2:
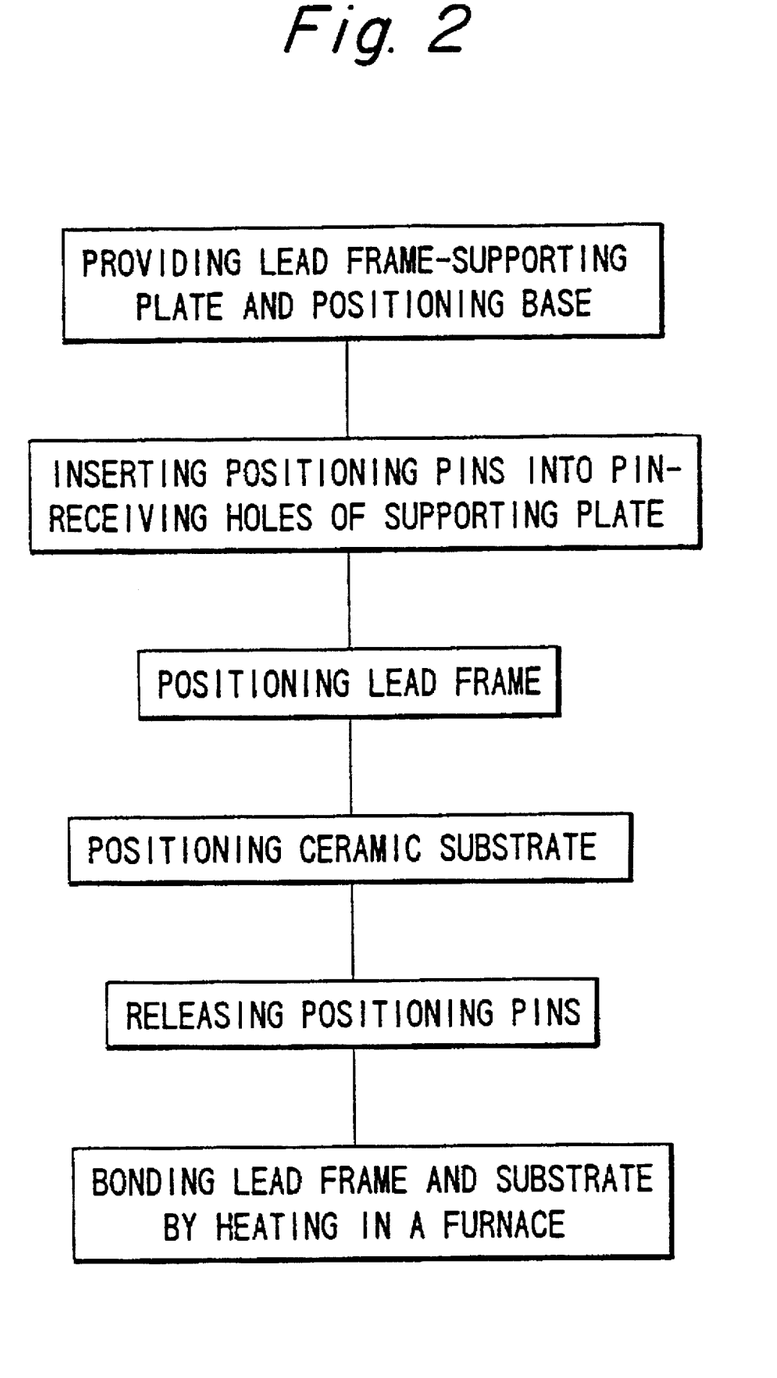
FIG. 2 is a flow chart illustrating the positioning of a lead frame and a ceramic substrate according to the present invention.

FIGS. 1(a) and 1(b) show a device for positioning and then bonding lead frame trains 1 and ceramic substrates 2 in the manufacture of CQFP's. Basically, the device comprises six parts, i.e., a lead frame-supporting plate 11, a positioning base 12, a driving mechanism 13 for vertically moving the positioning base 12, a lead frame-transferring unit 14, a substrate-transferring unit 15, and a heating furnace 16.

Figure 4:
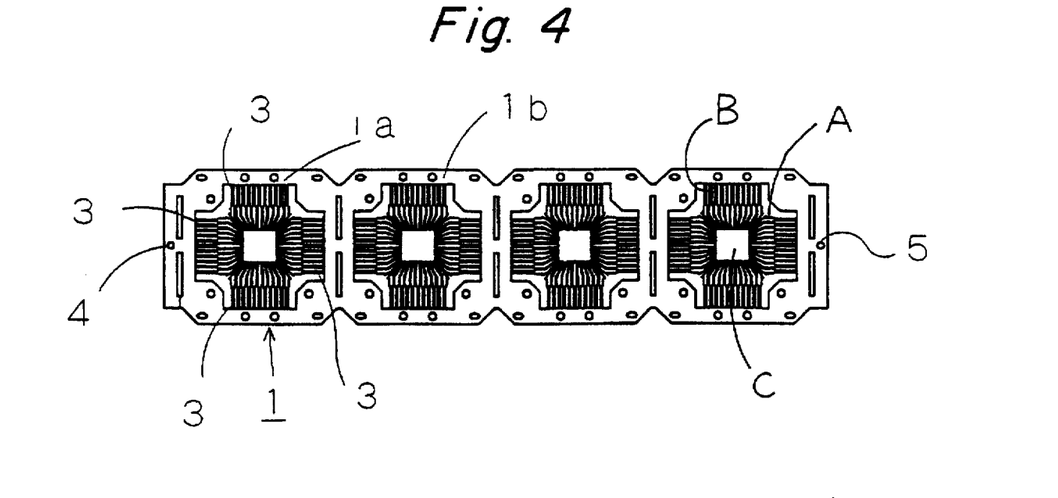
FIG. 4 is a plan view of a train of four lead frames used in the practice of the present invention.

As shown in FIG. 4, the lead frames used in this embodiment are in the form of a train 1 of four continuing lead frames 1a, 1b, etc., which is usually made of an Fe—Ni alloy such as Fe—42 Ni alloy (42 Alloy) or an Fe—Ni—Co alloy such as Kovar. Each of the lead frames 1a, 1b, etc. has an inner lead portion A to be connected to a semiconductor element and an outer lead portion B to be connected to external terminals, and the leads in the inner and outer lead portions extend in four directions in the manufacture of CQFP's. The lead frame train 1 has a registering hole 4 at one end for use as a basis of registration, and another registering hole 5 permitting a certain play (e.g., it is in the shape of an oval or ellipse) at the other end.

As shown in FIG. 1(a), each ceramic substrate 2 which is to be bonded individually to one of the lead frames 1a, 1b, etc., has a thermally fusible bonding material such as a sealing glass or resin applied to a sealing surface 6 of the substrate by coating or printing to form a bonding area 7.

Figures 3A, 3B:
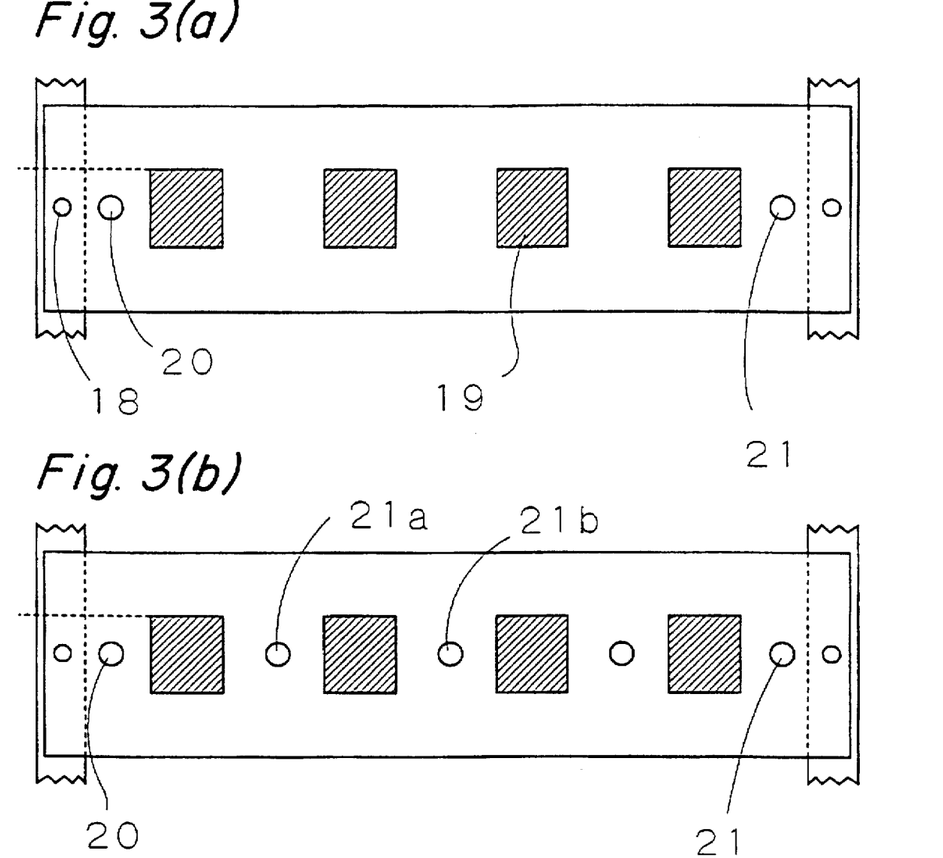
FIGS. 3(a) and 3(b) are plan views of lead frame-supporting plates used in the practice of the present invention.
Figure 5:
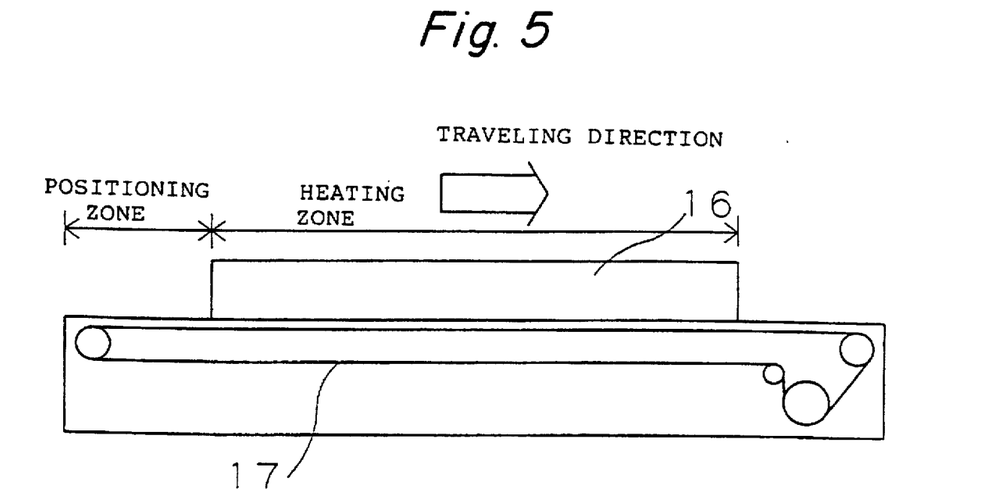
FIG. 5 is a schematic diagram showing a positioning zone and a heating zone in a preferred embodiment of the apparatus according to the present invention.

The lead frame-supporting plate 11 is a plate or board made of a heat resisting material such as stainless steel, on which the lead frame train 1 is positioned, so it may be a rectangle or elongate plate larger than the lead frame train 1. As shown in FIG. 3(a), the lead frame-supporting plate 11 has a pair of holes 18 at opposite ends thereof. A number of such plates are detachably mounted at regular intervals on an endless conveyor 17 by using the holes 18. The conveyor 17 is driven to pass through the heating furnace 16 as shown in FIGS. 1(b) and 5.

The lead frame-supporting plate 11 is also provided with openings 19 formed in positions matched to central areas of the lead frames 1a, 1b, etc., and pin-receiving holes 20, 21 formed in positions matched to the positions of the registering holes 4, 5 of the lead frame train 1. The openings 19, which are optional, have dimensions larger than those of central openings C of the lead frames, and prevent the bonding material, which is present in the bonding area 7 formed on the sealing surface 6 of the substrate 2, from adhering to the lead frame-supporting plate 11 when the substrate 2 is bonded to one of the lead frames of the lead frame train 1 placed on the plate 11.

The positioning base 12 is located beneath the conveyor 17 on the inlet side of the heating furnace 16 at a certain distance from the inlet. It may be an elongated member having a length nearly equal to or greater than the length of the lead frame-supporting plate 11, and it has positioning pins 22 formed in positions matched to those of the pin-receiving holes 20, 21 formed in the lead frame-supporting plate 11.

The pin-receiving holes 20, 21 of the plate 11 have a diameter larger than that of the positioning pins 22 on the base 12 so that there remains play, usually on the order of about 5 mm, between the positioning pins 22 and the edge of the pin-receiving holes 20, 21 after the positioning pins are passed through these holes as described below.

The positioning pins 22 on the positioning base 12 are long enough to pass through the pin-receiving holes 20, 21 of the lead frame-supporting plate 11 and protrude therefrom so as to maintain the lead frame train 1 by passing the pins 22 through the registering holes 4, 5 of the lead frame train 1. The number of positioning pins 22 is at least two and corresponds to the number of pin-receiving holes 20, 21 in the lead frame-supporting plate 11. The positioning base 12 is movable up and down in a vertical direction by the driving mechanism 13 located beneath the positioning base 12.

The heating furnace 16 is used to fuse the bonding material such as glass applied to the sealing surface 6 of each substrate 2, thereby bonding the substrate to one of the lead frames. Therefore, the heating temperature is equal to or higher than the fusing or melting temperature of the bonding material.

The driving mechanism 13 can lift the positioning base 12 in such a manner that the positioning pins 22 of the positioning base 12 are inserted into and passed through the pin-receiving holes 20, 21 of the lead frame-supporting plate 11, and thereafter lower the positioning base 12 such that the positioning pins 22 are withdrawn from the pin-receiving holes 20, 21. The driving mechanism 13 comprises an air cylinder 23 and a sensor 24 for detecting arrival of the lead frame-supporting plate 11 mounted on the conveyor 17 at a position above the positioning pins 22. The air cylinder 23 is actuated by means of a control unit 25 according to a detection signal from the sensor 24.

The lead frame-transferring unit 14 is located outside the conveyor 17 and beside the positioning base 12 in alignment therewith. It serves to transfer the lead frame train 1 from a lead frame-supplying station 26 onto the lead frame-supporting plate 11 and position it on the plate 11. The lead frame-transferring unit 14 comprises sucking pads 27 attached to a sucking pad holder 29, an air cylinder 28 for moving the sucking pad holder 29 up and down (vertically), and a driving mechanism (not shown) for moving the sucking pad holder 29 laterally (in the transverse direction of the travelling conveyor), and a sensor (not shown) for detecting completion of setting of the lead frame train 1 on the lead frame-supporting plate 11. The lateral movement of the sucking pad holder 29 is in alignment with the longitudinal (lateral) axis of the positioning base 12 and is controlled by the driving mechanism such that the registering holes 4, 5 of the lead frame train 1 are positioned so as to receive the positioning pins 22, which protrude through the pin-receiving holes 20, 21 of the lead frame-supporting plate 11.

The substrate-transferring unit 15 is also located outside the conveyor 17 and beside the positioning base 12 in alignment therewith (on the side opposite to the lead frame-transferring unit 14). It serves to center the substrate 2 and then transfer and position it onto the inner lead portion of one of the lead frames 1a, 1b, etc. of the lead frame train 1, which is positioned on the lead frame-supporting plate 11, by vertical and lateral movement in such a manner that the centers of the substrate and the lead frame are matched to each other in the lateral direction.

The substrate-transferring unit 15 comprises a substrate-centering/chuck device 31, a driving mechanism (not shown) for transferring the centered substrate 2 to a position on the lead frame train 1, and a sensor (not shown) for detecting completion of setting of the substrate 2 on the lead frame train 1. The substrate-centering/chuck device 31 may be a conventional centering device having a pair of chuck hands 33 of the same length, which grip opposite ends of the substrate 2, with a clamp shaft 34 at the center between the hands, to pick up the substrate and detect the center of the substrate 2 between the ends. Alternatively, a fully automated centering device using an optical sensing mechanism or the like may be used.

Ceramic semiconductor packages can be manufactured using the above-described apparatus by the following process.

The ceramic substrates may be produced by pressing a ceramic powder in a mold having a predetermined shape followed by firing, or by preparing a ceramic green sheet (single-layered or multi-layered) having a predetermined horizontal and vertical conductor pattern followed by firing. A thermally fusible bonding material such as glass is applied to the sealing surface 6 of the substrate to form the bonding area 7.

The manufacturing process starts with provision of a plurality of lead frame-supporting plates 11 and a positioning base 12, which have pin-receiving holes 20, 21 and positioning pins 22, respectively, in the positions matched to the positions of the registering holes 4, 5 of the lead frame train 1. The lead frame-supporting plates 11 are mounted on the conveyer 17 which is set so as to pass through the heating furnace 16. The positioning base 12 which is vertically movable by the driving mechanism 13 is located in a predetermined position on the inlet side of the heating furnace 16.

Either the bonding area 7 formed on the sealing surface of each substrate 2 or the area corresponding to the bonding area 7 on the surface of each lead frame facing the substrate 2 is preferably be coated or printed with a temporary adhesive which can be removed by heating. Examples of such an adhesive are a nitrocellulose-based or acrylic adhesive, although other adhesives may be used as long as they are removed during heating in the heating furnace.

Subsequently, intermittent (tact) driving of the conveyor 17 is started such that the lead frame-supporting plate 11 mounted on the conveyor 17 moves. As one of the lead frame-supporting plates 11 arrives at a position above the positioning base 12, the sensor 24 of the driving mechanism 13 for the positioning base 12 detects the arrival of the plate 11 and generates a signal. The signal is transmitted to the control unit 25 of the driving mechanism 13 to actuate upwardly the air cylinder 23 of the driving mechanism 13, thereby lifting the positioning base 12 such that the positioning pins 22 of the base 12 are inserted into and passed through the pin-receiving holes 20, 21 formed in the lead frame-supporting plate 11. The driving of the conveyer is controlled such that it is temporarily stopped when the detection signal is generated.

When the insertion of the positioning pins 22 is detected by a sensor (not shown), the resulting detection signal actuates the air cylinder 28 of the lead frame-transferring unit 14 in such a manner that the sucking pads 27 pick up a lead frame train 1 from the lead frame-supplying station 26 and move upward while holding the lead frame train. The sucking pads 27 holding the lead frame train 1 are then moved laterally (perpendicularly to the travelling direction of the conveyor and in alignment with the longitudinal axis of the positioning base) and then downwardly by a driving mechanism (not shown) such that the lead frame train is positioned on the lead frame-supporting plate 11 by passing the positioning pins 22 protruding from the plate 11 through the registering holes 4, 5 of the lead frame train.

When completion of positioning (setting) of the lead frame train 1 is detected by a sensor (not shown), the resulting detection signal actuates the substrate-centering/chuck device 31 in such a manner that the substrate 2 is picked up and centered by gripping opposite ends of the substrate 2 with the paired chuck hands 33 with the clamp shaft 34 at the center therebetween. The substrate-centering/chuck device 31 picking up and centering the substrate 2 is then moved laterally (in alignment with the longitudinal axis of the positioning base 12) by means of a driving mechanism (not shown) so as to position the substrate 2 on the inner lead portion of one of the lead frames 1a, 1b, etc. of the lead frame train 1 in such a manner that the center of the substrate in the lateral direction coincides with that of the lead frame. The center of the lead frame can be previously determined in a conventional manner, e.g., by actual measurement or from the data in designing the lead frame train, and can be recorded in a computer.

The centering and positioning procedure of the substrate 2 using the substrate-centering/chuck device 31 is repeated until each of the lead frames of the lead frame train 1 receives a substrate properly positioned thereon. Alternatively, all the lead frames can receive the substrates at the same time by using a substrate-centering/chuck device capable of picking up a plurality of substrates (four substrates in the illustrated case).

When completion of positioning (setting) of the substrates 2 on all the lead frames 1a, 1b, etc. is detected, the resulting signal actuates the air cylinder 23 of the positioning base-driving mechanism 13 so as to move it downward, thereby causing the positioning pins 22 of the positioning base 12 to be withdrawn from both the registering holes 4, 5 of the lead frame train 1 and the pin-receiving holes 20, 21 of the lead frame-supporting plate 11, thereby releasing the positioning pins 22.

After the positioning pins 22 are released, the conveyor 17 is driven again such that the lead frame-supporting plate 11, on which the lead frame train 1 and the substrates 2 are set in position and preferably temporarily bonded, is conveyed stepwise toward the heating furnace 16. While the supporting plate 11 is passed through the furnace 16 for heating, the temporary adhesive applied to the bonding area of either each substrate or lead frame is removed by evaporation or sublimation, and thereafter the bonding material applied to the sealing surface 6 of each substrate to form the bonding area 7 is fused to bond the substrate and the lead frame.

Intermittent driving of the conveyor 17 permits the above-described procedure of positioning and setting the lead frame train 1 and substrates 2 to be performed repeatedly whenever one of the lead frame-supporting plates 11 mounted on the conveyor 17 arrives at a position above the positioning base 12. The positioned lead frame train 1 and substrates 2 are then conveyed into the heating furnace 16 consecutively by the conveyor 17 to bond the lead frames and substrates.

By using the above-described process and apparatus according to the present invention for positioning and setting lead frames or lead frame trains and ceramic substrates followed by heating in a furnace for bonding, ceramic semiconductor packages having improved positioning accuracy can be manufactured continuously.

The ceramic semiconductor packages thus manufactured can be used to mount an IC chip thereon in a conventional manner.

The process and apparatus of the present invention have been described with respect to a lead frame train 1 having a plurality of lead frames (four lead frames in FIG. 4).

When a single lead frame is used, the lead frame-supporting plate 11 can be modified as shown in FIG. 3(b). The lead frame-supporting plate 11 shown in FIG. 3(b) has a pin-receiving hole 20 at one end for use as a basis of registration. The supporting plate 11 has additional pin-receiving holes 21a, 21b, etc. formed at the same intervals as that of the registering holes of the single lead frame. In such cases, the positioning base 12 is also modified such that it has additional positioning pins 22 in positions matched to those of the additional pin receiving holes 21a, 21b, etc of the supporting plate 11. The single lead frame is positioned repeatedly generally in the same manner as described for the lead frame train except that adjacent positioning pins are used to pass through registering holes of each single lead frame.

Naturally, the process and apparatus of the present invention can be applied to a lead frame train having five or more lead frames.

It was confirmed that the process and apparatus of the present invention can manufacture ceramic semiconductor packages having a dimensional accuracy which is improved by a factor of 3 to 4 compared to those manufactured using a conventional positioning jig as shown in FIG. 6. It is thought that the improved positioning accuracy is attained for the following reasons.

1) Contrary to a conventional process, substrates are placed on lead frames, and the substrates is positioned on the lead frames by centering each substrate and putting it on a lead frame with the center of the substrate coinciding with that of the lead frame. As a result, the dimensional accuracy of the substrate ($\pm\delta x_1$), which fluctuates significantly, has little influence on the positioning accuracy of the substrates on the lead frame.

2) Since a jig having a recess for receiving the substrate is not used, there is no need to consider the tolerance of finished dimensions of a recess ($\pm\delta y_1$). Furthermore, since the positioning pins are removed from the lead frames and substrates after positioning of these members is completed, there is no need to consider the tolerance of the distance between the positioning pins ($\pm\delta y_3$).

3) In the present invention, it is necessary to consider the repeat accuracy of automation since lead frames and substrates are positioned on lead frame-supporting plates repeatedly by an automation system. However, the repeat accuracy is as small as $\pm 0.05$ mm.

As a result, the overall positioning accuracy in the present invention is on the order of $\pm 0.07$ mm including the repeat accuracy of automation, as shown in Table 2 below.

TABLE 2

| Dimension | Accuracy or Tolerance |
| --- | --- |
| Substrate, $x_1$ | $\pm\delta x_1$ = approx. 0 |
| Jig, $y_1$ | $\pm\delta y_1$ None |
| Jig, $y_2$ | $\pm\delta y_2$ = $\pm 0.05$ mm |
| Jig, $y_3$ | $\pm\delta y_3$ None |
| Overall accuracy: | $\pm 0.07$ mm |

The positioning accuracy attained by use of a conventional jig is from $\pm 0.18$ mm to $\pm 0.27$ mm. Therefore, it will be understood that the positioning accuracy in the manufacture of ceramic semiconductor packages according to the present invention is significantly improved.

It will be appreciated by those skilled in the art that numerous variations and modifications may be made to the invention as described above with respect to specific embodiments without departing from the spirit or scope of the present invention as broadly described. For example, the positioning pins may be formed such that they are detachable from a base rather than movable up and down by a driving mechanism. Other modifications will occur to those skilled in the art within the scope of the present invention.

What is claimed is:

1. A process for manufacturing ceramic semiconductor packages by positioning (1) one or more lead frames or a train of lead frames having registering holes in the peripheral portion thereof, each lead frame having an inner lead portion to be connected to a semiconductor element and an outer lead portion to be connected to external terminals, and (2) one or more ceramic substrates each having a thermally fusible bonding material applied to a sealing surface of the substrate, followed by heating to fuse the bonding material to bond the lead frames and the substrates together, wherein the process comprises the steps of:

providing a lead frame-supporting plate having pin-receiving holes for registration in positions matched to the positions of the registering holes of the lead frames when the lead frames are positioned on the supporting plate;

providing a positioning base beneath the lead frame-supporting plate, said positioning base having positioning pins at the same intervals as the registering holes of the lead frames;

lifting the positioning base until the positioning pins of the base pass through the pin-receiving holes of the lead frame-supporting plate and protrude therefrom;

positioning the lead frames or lead frame train on the lead frame-supporting plate such that the positioning pins of the positioning base, which protrude from the plate, pass through the registering holes of the lead frames;

centering and positioning each of the ceramic substrates, with its sealing surface facing down, on the inner lead portion of each lead frame on the lead frame-supporting plate, the positioning being performed in such a manner that the center of the substrate coincides with that of the lead frame; and lowering the positioning base until the positioning pins of the base are withdrawn from the registering holes of the lead frames and from the pin-receiving holes of the lead frame-supporting plate.

2. The process according to claim 1 wherein a temporary adhesive which can be removed by heating is applied to the bonding area of each ceramic substrate or lead frame such that the substrate positioned on the inner lead portion of the lead frame is temporarily secured to the lead frame by the adhesive before the lead frame and the substrate are bonded by fusing the bonding material applied to the sealing surface of the substrate.

3. The process according to claim 1 wherein the ceramic semiconductor packages are ceramic quad flat packages.

4. An apparatus for manufacturing ceramic semiconductor packages by positioning (1) one or more lead frames or a train of lead frames having registering holes in the peripheral portion thereof, each lead frame having an inner lead portion to be connected to a semiconductor element and an outer lead portion to be connected to external terminals, and (2) one or more ceramic substrates each having a thermally fusible bonding material applied to a sealing surface of the substrate, followed by heating to fuse the bonding material to bond the lead frames and the substrates together, wherein the apparatus comprises:

- a lead frame-supporting plate having pin-receiving holes for registration in positions matched to the positions of the registering holes of the lead frames when the lead frames are positioned on the supporting plate;
- a vertically movable positioning base beneath the lead-frame-supporting plate, said positioning base having positioning pins at the same intervals as the registering holes of the lead frames;
- means for vertically moving the positioning base to allow the positioning pins of the base to pass through the pin-receiving holes of the plate and protrude therefrom;
- means for positioning the lead frames or lead frame train on the lead frame-supporting plate such that the positioning pins of the positioning base, which protrude from the lead frame-supporting plate, pass through the registering holes of the lead frames; and
- means for centering and positioning the ceramic substrates, said means capable of centering a ceramic substrate and then positioning it, with its sealing surface facing down, on the inner lead portion of each lead frame on the lead frame-supporting plate in such a manner that the center of the substrate coincides with that of the lead frame.

5. The apparatus according to claim 4 wherein a plurality of the lead frame-supporting plates are mounted on a conveyor, which is passed through a heating furnace to fuse the bonding material applied to the sealing surface of the substrate so as to bond the lead frame and the substrate, and wherein the positioning base is located independently of the conveyor in front of the inlet of the heating furnace.

6. The apparatus according to claim 4 wherein the ceramic semiconductor packages are ceramic quad flat packages.

7. The apparatus according to claim 4 wherein the means for centering and positioning the ceramic substrates comprises a substrate-centering/chuck device.

* * * * *